(12) United States Patent
Amine et al.

(10) Patent No.: US 9,593,413 B2
(45) Date of Patent: Mar. 14, 2017

(54) COMPOSITE MATERIALS FOR BATTERY APPLICATIONS

(75) Inventors: Khalil Amine, Oak Brook, IL (US);
Junbing Yang, Bolingbrook, IL (US);
Ali Abouimrane, Naperville, IL (US);
Jianguo Ren, Wheaton, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 840 days.

(21) Appl. No.: 13/100,579

(22) Filed: May 4, 2011

(65) Prior Publication Data
US 2012/0282527 A1 Nov. 8, 2012

(51) Int. Cl.
| | |
|---|---|
| C23C 16/04 | (2006.01) |
| C23C 16/442 | (2006.01) |
| B82Y 40/00 | (2011.01) |
| C01B 31/04 | (2006.01) |
| H01M 4/587 | (2010.01) |
| H01M 4/36 | (2006.01) |
| C23C 16/40 | (2006.01) |
| H01M 4/38 | (2006.01) |
| C23C 16/06 | (2006.01) |
| C23C 16/24 | (2006.01) |
| B82Y 30/00 | (2011.01) |

(52) U.S. Cl.
CPC ............ *C23C 16/045* (2013.01); *B82Y 30/00* (2013.01); *B82Y 40/00* (2013.01); *C01B 31/0415* (2013.01); *C01B 31/0476* (2013.01); *C23C 16/06* (2013.01); *C23C 16/24* (2013.01); *C23C 16/40* (2013.01); *C23C 16/403* (2013.01); *C23C 16/442* (2013.01); *H01M 4/366* (2013.01); *H01M 4/386* (2013.01); *H01M 4/587* (2013.01)

(58) Field of Classification Search
USPC .......... 427/248.1, 250, 252, 255.23, 255.28, 427/255.29, 255.32
See application file for complete search history.

(56) References Cited

U.S. PATENT DOCUMENTS

| | | | |
|---|---|---|---|
| 5,624,606 A * | 4/1997 | Wilson et al. ................ 252/506 |
| 7,745,047 B2 | 6/2010 | Zhamu et al. | |
| 2006/0112857 A1* | 6/2006 | Hougham et al. ............ 106/472 |
| 2006/0121279 A1* | 6/2006 | Petrik .................... B82Y 30/00 428/403 |
| 2007/0092432 A1* | 4/2007 | Prud'Homme ....... C01B 31/043 423/448 |
| 2008/0261116 A1* | 10/2008 | Burton et al. ............. 429/231.8 |
| 2009/0117467 A1* | 5/2009 | Zhamu et al. ............. 429/231.8 |
| 2009/0269511 A1* | 10/2009 | Zhamu et al. ................ 427/558 |
| 2009/0325071 A1 | 12/2009 | Verbrugge et al. | |
| 2011/0111303 A1* | 5/2011 | Kung et al. ................ 429/231.8 |

(Continued)

OTHER PUBLICATIONS

"Chemical Vapor Deposition". Merriam Webster, Found at http://www.merriam-webster.com/dictionary/chemical%20vapor%20deposition.*

(Continued)

*Primary Examiner* — Dah-Wei D Yuan
*Assistant Examiner* — Jose Hernandez-Diaz
(74) *Attorney, Agent, or Firm* — Foley & Lardner LLP (57) ABSTRACT

A process for producing nanocomposite materials for use in batteries includes electroactive materials are incorporated within a nanosheet host material. The process may include treatment at high temperatures and doping to obtain desirable properties.

10 Claims, 6 Drawing Sheets

(56) References Cited

U.S. PATENT DOCUMENTS

2011/0217217 A1\* 9/2011 Bandosz et al. ............. 423/226
2012/0251886 A1 10/2012 Yushin et al.
2012/0288750 A1 11/2012 Kung et al.

OTHER PUBLICATIONS

International Search Report and Written Opinion issued on PCT/US2012/035033, mailed Dec. 3, 2012.

Wang, G., et al., "Sn/graphene nanocomposite with 3D architecture for enhanced reversible lithium storage in lithium ion batteries," J. Mater. Chem., 19, Oct. 5, 2009, pp. 8378-8384.

Xiang, H. et al., "Graphene/nanosized silicon composites for lithium battery anodes with improved cycling stability," Carbon 49 (2011) Jan. 9, 2011, pp. 1787-1796 and supplemental information, 5 pages.

Yao, et al., "In situ chemical synthesis of $SnO_2$-graphene nanocomposite as anode materials for lithium-ion batteries," Electrochem. Comm., 11 (2009) Aug. 6, 2009, pp. 1849-1852.

Chou, S. et al., "Enhanced reversible lithium storage in a nanosize silicon/graphene composite," Electrochemistry Communications, 12(2), 2010, pp. 303-306.

Lee, J. et al., "Silicon nanoparticles-graphene paper composites for Li ion battery anodes," Chemical Communications, 46(12), 2010, pp. 2025-2027.

Wu, Z. et al., "Synthesis of high-quality graphene with a pre-determined number of layers," Carbon 47(2), 2009, pp. 493-499.

\* cited by examiner

COMPOSITE MATERIALS FOR BATTERY APPLICATIONS

STATEMENT OF GOVERNMENT INTEREST

The United States Government claims certain rights pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD

The technology is generally related to lithium ion batteries. More specifically, it is related to nanocomposite materials that can be used as anode materials for lithium ion batteries.

BACKGROUND

The use of Li-ion batteries (LIBs) as rechargeable power sources represents a promising technology for use in consumer electronics and automobiles. However, there are substantial technical challenges to the use of LIBs for automobile applications.

LIBs typically use lithium metal oxides such as $LiCoO_2$ as the cathode; carbon or graphite as the anode; and a lithium salt such as $LiPF_6$ in an organic solvent (e.g., organic carbonates) as the electrolyte. Since its commercialization, the capacity of LIBs has increased about 1.7 times due to improvements in battery structure, and anode or cathode materials. The capacity of the LIBs has been improved typically by increasing the amount of the active materials in the cathode, and anode, and by decreasing the thickness of the current collector, separator, and cell casing. For example, LIB capacity has improved by utilizing new cathode materials, such as layered $Li[Ni_xCO_yMn_z]O_2$ and related materials. Use of such new materials has provided about 9 to about 25% increase in the total mAh/g capacity over commercial cells; but this is still insufficient to satisfy the requirements of plug-in hybrid electric vehicles (PHEVs) or electric vehicles (EVs).

In addition to cathode materials, improved anode materials have also been investigated. Anode materials for LIBs typically fall into one of two types of materials: intercalation materials and alloy-forming materials. Graphite falls in the first category and allows intercalation of Li ions into its carbon layers for storage of lithium. Graphite exhibits good charge/discharge cycle stability, but low capacity. The theoretical capacity of graphite is 372 mAh/g based on a theoretical Li-to-C ratio (Li:C) of about 1:6 (i.e., $LiC_6$).

Alloy-forming materials include, but are not limited to, Si, Sn, Pb, Al, Au, Pt, Zn, Cd, Ag, and Mg, can be used as alternatives to graphite. These materials store Li by forming alloys with Li. Si is one of the most attractive because of its relatively low discharge potential, the theoretical capacity (about 4200 mAh/g based on $Li_{4.4}S$) and significant natural reserve (Si is the second most abundant element on earth). The disadvantage of alloy-forming materials such as Si is that the capacity fades rapidly due to very large volume expansions upon alloy formation. The large expansion and following contraction can cause disruption (e.g., pulverization) of the electrode and loss of electric contact between electrode materials limiting the cycle stability of these anode materials. For example, Si may undergo up to 400% volume change during the alloying and de-alloying process. Bulk Si is also not desirable as anode material because of a relatively low electrical conductivity, which can reduce the capacity of the LIBs.

Further improvement of LIBs require the development of new anode materials with desired properties.

SUMMARY

According to one aspect, a process is provided which includes contacting a gaseous electroactive material precursor with a carbonaceous, exfoliated nanosheet material to form a nanocomposite material. The carbonaceous, exfoliated nanosheet material has a plurality of layers. The nanocomposite material has an electroactive material is intercalated between individual layers of the plurality of layers; an electroactive material is deposited on one or more surfaces of the individual layers of the plurality of layers; or an electroactive material is both intercalated between individual layers of the plurality of layers and deposited on one or more surfaces of the individual layers of the plurality of layers. In some embodiments, the carbonaceous, exfoliated nanosheet material is graphene.

In some embodiments, the electroactive material includes Si, Sn, Pb, Al, Au, Pt, Zn, Cd, Ag, Mg, or Mo. In some embodiments, the electroactive material includes an oxide of Si, Sn, Pb, Al, Au, Pt, Zn, Cd, Ag, Mg or Mo. In some embodiments, the electroactive material includes Si or Sn. In some embodiments, the electroactive material is not the same as the layered nanosheet material.

In some embodiments, contacting the gaseous electroactive material precursor with the carbonaceous, exfoliated nanosheet material includes depositing the gaseous electroactive material precursor by using chemical vapor deposition. In some embodiments, the contacting includes depositing the gaseous electroactive material precursor using a fluidized bed chemical vapor deposition process. In some embodiments, the chemical vapor deposition includes pyrolytic or plasma-assisted deposition. In some embodiments, the electroactive material precursor is in the vapor phase prior to deposition, while in other embodiments, the electroactive material is in the liquid phase prior to deposition. In some embodiments, the gaseous electroactive material precursor includes one or more silicon-containing compounds, or one or more tin-containing compounds. In some embodiments, the electroactive material precursor includes a silicon-containing compound such as, but not limited to, silane, silicon tetrachloride, trichlorosilane, trichloromethylsilane, dichlorosilane, dichloromethylsilane, dichlorodimethylsilane, chlorotrimethylsilane, chlorosilane, chloromethylsilane, chlorodimethylsilane, phenylsilane, tetramethoxysilane, tetraethoxysilane, cyclopropylsilane, cyclobutylsilane, cyclopentylsilane, cyclohexylsilane, cyclooctylsilane, diphenylsilane, dicyclohexylsilane, n-butylmethylsilane, tert-butylmethylsilane, or tert-butylphenylsilane. In some embodiments, the electroactive material precursor includes a tin-containing compound such as, but not limited to, monobutyltin trichloride, methyltin trichloride, isobutyltin trichloride, butyl dichlorotin acetate, butyldichlorotin dicetate, diisobutyltin dichloride, methyltin trichloride, dimethyltin dichloride, dibutyltin dichloride, di-t-butyltin dichloride, or tin tetrachloride.

In some embodiments, the carbonaceous, exfoliated nanosheet material includes a dopant. Such dopants may include, but are not limited to N, S, or O. In some embodiments, the process further includes heating the nanocomposite material to a temperature between 500° C. to 1500° C. In some embodiments, the heating is conducted in the presence of a reactive gas. In some embodiments, the reactive gas includes hydrogen, ammonia, a phosphorus-containing gas, or a boron-containing gas.

In another aspect, a material is provided that is prepared by any of the described processes. In another aspect, an electrochemical device is provided, the device including any such materials. In some embodiments, the electrochemical device includes an anode including the material. In some embodiments, the electrochemical device is a lithium primary battery, a lithium secondary battery, a capacitor or a lithium air battery.

In another aspect, a process is provided that includes providing graphene where the graphene has a plurality of layers in a layered nanosheet structure, and introducing to the graphene an electroactive material precursor with Si or Sn to produce a nanocomposite material. The nanocomposite material includes an electroactive material that is intercalated between individual layers of the plurality of layers; deposited on one or more surfaces of the individual layers of the plurality of layers; or is both intercalated between individual layers of the plurality of layers and deposited on one or more surfaces of the individual layers of the plurality of layers.

BRIEF DESCRIPTION OF THE DRAWINGS

FIGS. 4 A and 4B are graphs of the voltage v. capacity during the first charge and discharge of a reduced silicon-graphene nanocomposite material, prepared according to Example 7.

DETAILED DESCRIPTION

The illustrative embodiments described in the detailed description are not meant to be limiting. Other embodiments may be utilized, and other changes may be made, without departing from the spirit or scope of the subject matter presented here.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

As used herein, "graphene" refers to planar sheets of $sp^2$-bonded carbon atoms that are densely packed in a honeycomb crystal lattice. It can be viewed as an atomic-scale, layered, chicken wire made of carbon atoms and their bonds.

As used herein, "carbonaceous" refers to a material rich in carbon.

As used herein, "nanosheet material" refers to a material containing sheets or layers with a thickness from a few nanometers to about two hundred nanometers. The nanosheet material serves as support material for the electroactive material, and provides dimensional stability for the lithium alloy formed during the lithiation and delithiation process, as well as establishing an electronic conducting pathway within the electrode.

In one aspect, a process is provided for incorporating electroactive materials within a nanosheet material to produce nanocomposite materials. Such materials may be used in a wide variety of applications including, but not limited to battery applications. The nanosheet materials are those which are carbonaceous, and which have an exfoliated nanosheet structure with a plurality of layers. As used herein the term exfoliated refers to expansion of the layered structure to allow for interaction of other species within the layers.

In some embodiments, the nanosheet materials are pre-treated by thermal shock done under an inert gas such as nitrogen, helium, or argon. The presence of the inert gas reduces the occurrence of oxidation of the nanosheet material, thereby maintaining the conductivity of the graphene. The thermal shock treatment expands the natural graphite to graphene.

In other embodiments, the composite material is prepared by using a natural graphite intercalation compound (GIC). Natural graphite is subjected to an intercalation/oxidation treatment by immersing graphite powder in a solution of sulfuric acid, nitric acid, and potassium permanganate for between 1 to 24 hours. The powder is then isolated from the acids and dried. The dried powder is then subjected to thermal shock (e.g., 1,000° C. for 15-30 seconds) to obtain exfoliated graphite worms, which are networks of interconnected exfoliated graphite flakes with each flake containing a multiplicity of, graphene sheets or layers. The exfoliated graphite is then subjected to mechanical shearing to break up the graphite flakes and produce graphene. The mechanical shearing may be accomplished using any of a variety of techniques including, but not limited to, air milling, ball milling, or ultrasonication. After the pre-treatment, the nanosheet may be further treated to form nanocomposite materials.

Figure 1A:
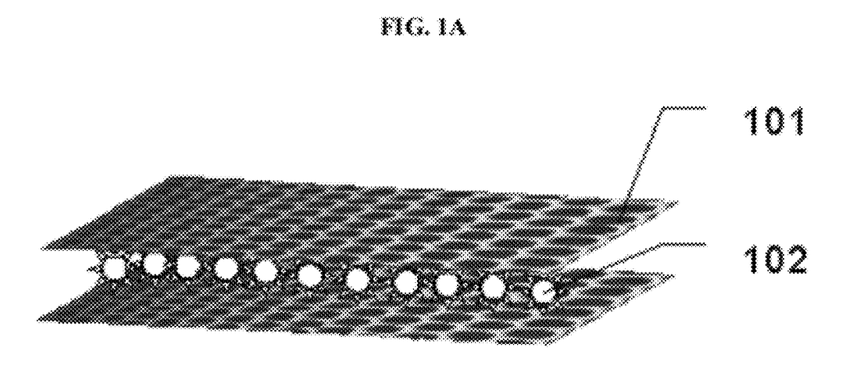
FIGS. 1A and 1B are schematic illustrations of a layered material having an electroactive material deposited between (1A) or on (1B) the individual layers, according to some embodiments.
Figure 1B:
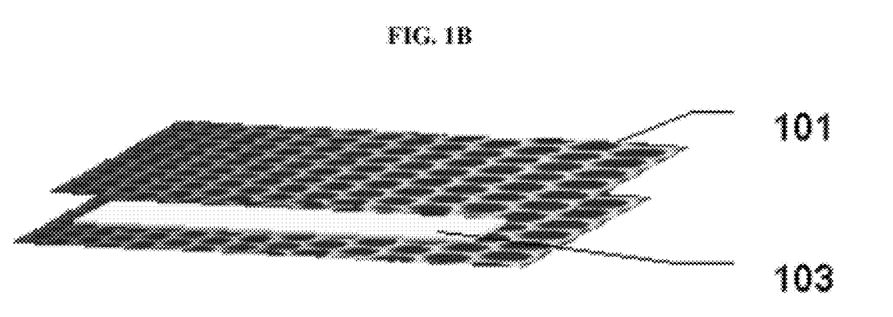

FIGS. 1A and 1B are schematic illustrations of the nanocomposite material having particulate or film electroactive materials. FIG. 1A illustrates the case where layers 101 of the nanocomposite material are intercalated with particles of the electroactive material 102. In FIG. 1B, the nanocomposite layers 101 have a film or coating of the electroactive material 103 between the layers.

As illustrated in FIGS. 1A and 1B, the nanocomposite material includes the electroactive material either between, or on, individual layers of the nanosheet host as a particle, or as a film that is between, or on, individual layers of the nanosheet host. Thus, in some embodiments, the electroactive material is intercalated between individual layers of the plurality of layers; the electroactive material is deposited on one or more surfaces of the individual layers of the plurality of layers; or the electroactive material is both intercalated between individual layers of the plurality of layers and deposited on one or more surfaces of the individual layers of the plurality of layers. The nanocomposite material is formed when a gaseous electroactive material precursor is contacted with the carbonaceous, exfoliated nanosheet material and the precursor then is converted into the electroactive material. According to some embodiments, converting the precursor to the electroactive material includes pyrolysis.

Suitable nanosheet materials are carbonaceous substances that include, but are not limited to, graphene, graphite, carbon nanotubes, carbon fiber, activated carbon, porous carbon, and glassy carbon. In some embodiments, the nanosheet material is graphene. Graphene is suitable because it has a high surface area, good electric conductivity, and good electrochemical stability. Graphene consists of a two-dimensional (2D) sheet of covalently bonded carbon atoms and it forms the basis of both 3D graphite and 1D carbon nanotubes. Graphene has a thermal conductivity of up to ~5,300 W/mK, and it exhibits exceptional in-plane electrical conductivity (up to ~20,000 S/cm), an ultra-high Young's modulus (approximately 1,000 GPa), and high intrinsic strength (~130 GPa, estimated). In some embodiments, the nanosheet material is graphene. In some embodiments, the nanosheet material is graphite.

As noted above, the nanosheet material is exfoliated, thereby exposing several individual sheets (i.e. individual layers). The nanosheets have dimensions which are on the nanometer (nm) scale in thickness, and one the micrometer (μm) in the planar dimensions. For example, a single nanosheet of the material may have a length of no more than about 60 μm and a length of no more than about 60 μm. In some embodiments, the nanosheet has length of about 50 nm to about 20 μm, and individually a length of about 50 nm to about 20 μm. A single nanosheet of the material may have a thickness of about 0.1 nm to about 1 nm. In some embodiments, a single layer or sheet of the nanosheet material is about 0.335 nm thick. The bulk nanosheet material may include a plurality of nanosheets, wherein the plurality of nanosheets has a stack thickness of up to about 200 nm. In some embodiments, the thickness of stack of the layers is from about 0.67 nm to about 100 nm.

Electroactive materials suitable for use in the methods include many known electroactive materials, particularly elements of Groups III, IV and V of the periodic table. Such electroactive materials are capable of lithiation and de-lithiation by formation of alloys and desorption of the Li. These elements may be alloyed or mixed with other metals. In some embodiments, the electroactive material includes Si, Sn, Pb, Al, Au, Pt, Zn, Cd, Ag, Mg, Mo or mixtures thereof. In some embodiments, the electroactive material includes an oxide of Si, Sn, Pb, Al, Au, Pt, Zn, Cd, Ag, Mg, Mo or mixtures thereof. In some embodiments, the electroactive material may be a mixture of a metal and a metal oxide. In some embodiments, the electroactive material is Si or Sn. The Si may be crystalline Si, amorphous Si, or Si compounds such as silicon carbide and silicon oxide, or mixtures thereof.

In some embodiments, the electroactive material is substantially homogenously intercalated within the plurality of layers. The process provided for preparing nanocomposite materials is in contrast to the previously used physical mixing approaches. It is difficult to achieve nanoscale deposition of Si inside the graphene layers through physical mixing approaches alone, due to the agglomeration of Si nanoparticles and high surface tension in liquid phase. As a result, nanocomposite materials prepared by physical mixing have agglomerated electroactive materials along the edges of the layered material, instead of homogenously distributed within the interior of the layered material. Although these materials can achieve some limited capacity, such as 1000 mAh/g, the capacity degradation of such anodes is large with a loss of 51% of the capacity after 300 cycles as seen in Lee, et al., Chem. Communications, 46(12): 2025-2027. In contrast, the Si-Graphene composite materials exhibit a substantially smaller loss in reversible capacity. This is further illustrated in the examples.

The electroactive material may be formed as particle or film on the surface of the nanosheet material or as a particle or film between the layers. In some embodiments, the electroactive material may be present as particles intercalated between the layers of the nanosheet, particles incorporated into a single layer of the sheet, or deposited on the surface of the nanosheet material. In some embodiments, the electroactive material may be present as both a film and as a particle. Where the electroactive material is present as a particle, the particles may have a diameter from about 2 nm to about 2 μm, or from 100 nm to 1 μm.

The electroactive material is formed by decomposition of a gaseous electroactive material precursor, during, or after, impregnation of the exfoliated nanosheet material. This allows the gaseous precursor to penetrate the individual layers more fully than if liquid or solid phase techniques were used. The precursor may include one or more silicon-containing compounds, or one or more tin-containing compounds. Suitable electroactive material precursors include silicon-containing compounds such as, but not limited to, silane, silicon tetrachloride, trichlorosilane, trichloromethylsilane, dichlorosilane, dichloromethylsilane, dichlorodimethylsilane, chlorotrimethylsilane, chlorosilane, chloromethylsilane, chlorodimethylsilane, phenylsilane, tetramethoxysilane, tetraethoxysilane, cyclopropylsilane, cyclobutylsilane, cyclopentylsilane, cyclohexylsilane, cyclooctylsilane, diphenylsilane, dicyclohexylsilane, n-butylmethylsilane, tert-butylmethylsilane, or tert-butylphenylsilane. In some embodiments, the electroactive material precursor includes a tin-containing compound such as, but not limited to, monobutyltin trichloride, methyltin trichloride, isobutyltin trichloride, butyl dichlorotin acetate, butyldichlorotin dicetate, diisobutyltin dichloride, methyltin trichloride, dimethyltin dichloride, dibutyltin dichloride, di-t-butyltin dichloride, or tin tetrachloride.

The electroactive materials may be deposited on the surface of the nanosheet material by a variety of different methods. For example, such methods include, among others, liquid-phase deposition, electrodeposition, dip-coating, evaporation, sputtering, and chemical vapor deposition (CVD).

In some embodiments, the composite material is prepared by CVD. Such methods include, contacting a gaseous electroactive material precursor with a carbonaceous, exfoliated nanosheet material. In a typical CVD process, the substrate or host is exposed to one or more volatile CVD precursors, which react and decompose on the substrate surface to produce a deposit. CVD is one of the most efficient techniques for modification and control of the surface state of powders. The use of gases allows for formation of cluster distributions on all porous surfaces, and, thus, achieves nano-scale homogenous distribution of the electroactive materials within the layers or sheets of the nanosheet material.

In one illustrative example, gaseous silane ($SiH_4$) is contacted with the nanosheet material host at 600° C. to give a uniform deposition of Si on or in between layers or sheets of the graphene according to the following reaction scheme:

$$SiH_4 \rightarrow Si + 2H_2$$

As another illustrative example, the Si is deposited using a gas feed containing a mixture of hydrogen and trichlorosilane in a fluidized bed reactor containing the nanosheet materials at high temperature. Decomposition of the trichlorosilane causes the deposition of elemental Si on the surface or between the layers or sheets of the graphene nanosheets according to the following reaction scheme:

$$HSiCl_3(g) + H_2(g) = Si(s) + 3HCl(g)$$

Fluidized bed reactors allow for a large contact area between the graphene and the silicon-bearing gases in a heated chamber, enhancing the thermal decomposition of the silicon-bearing gases. Upon decomposition of the gases, high-purity, elemental Si coatings or deposits on the surface of the graphene layers, or Si-intercalated within the layers of the nanocomposite material are formed In some embodiments, the nanocomposite material is a Si-Graphene nanocomposite. Strong bonding between the Si and graphene material helps stabilize the nanocomposite material during lithiation and delithiation cycles. The mesoporous structure of the graphene nanosheet and outstanding elastic deformability serves as a buffer layer allowing for the large volume expansion exhibited by the Si when it is alloyed with Li. During delithiation, the graphene is able to regain its original structure with minimal irreversible damage. In addition, when the Si-graphene nanocomposite is used as an anode in an electrochemical cell, the problem of delamination is minimized because the nanosheet structure of the graphene has many voids into which the Si can expand without being in physical contact with the current collector. Thus, the nanocomposites avoid the delamination associated with other systems.

In the Si-Graphene composite, the presence of the graphene improves the cycling performance of the nanocomposite materials by increasing the electrical conductivity and acting as an electrochemical buffer, thereby reducing electrochemical sintering or coalescence of the fine Si particles. Further, when the amount of graphene in the nanocomposite material reaches a certain threshold volume fraction (percolation condition), graphene may form a continuous path for electrons, thereby improving electrical conductivity significantly. Although not bound by theory, the inventors consider the Si-graphene composites to be a double-phased material where both phases, the graphene and the Si, are active toward Li within the same potential window. Si-graphene composite materials can achieve fast charge and discharge rates because of their high surface area (200 m$^2$/g to 1000 m$^2$/g), their mesoporosity, and their relatively high electronic conductivity. The charge discharge rate can be in the range of C/3 to 3C, which is sufficiently fast for PHEV and EV applications.

In some embodiments, the graphene is doped with a heteroatom to enhance the cycle stability of the electroactive materials. Suitable heteroatoms include, but are not limited to, N, S, and O. Although not to be bound by theory, it is understood that incorporation of N, S, and O creates defects on the graphene layers, which facilitate the initial nucleation of silicon seeds on the graphene layers. More silicon seeds mean more uniform and smaller silicon particles on graphene layers at a given silicon loading. Smaller silicon particles lead to improved cycle stability.

Optionally, nanocomposite materials produced by the processes may be heat-treated in the presence of a reactive gas. Where heat treatment is used, the nanocomposite materials are heated to from 500° C. to 1500° C. The reactive gas in such methods may be hydrogen, ammonia, a phosphorus containing gas, a boron-containing gas or a mixture of any two or more of such gases. Under these conditions, oxygen-containing functional groups which may be present on the surface of the Si-Graphene composite material are reduced. Such oxygen-containing groups may be present due to the conditions and reactions used to prepare an exfoliated graphene, and may include lactone, ketone, phenol, ether, carboxyl, anhydride, and the like. Such treatments may also improve the first cycle efficiency, reversible capacity and/or cycle stability performance of the nanocomposite material.

Although not bound by theory, it is believed that the heat treatment causes a phase-change within the composite material such that hydrogenated Si under low temperature is converted to polycrystalline Si with higher capacity. In addition, the high temperature treatment is believed to cause densification of the nanocomposite material. The increase in density of the nanocomposite may improve the contact between the graphene and Si, thereby improving stability. Accordingly, heat treatment may increase the density of the nanocomposite from about 10% to about 50%, in some embodiments. In other embodiments, the density increases from about 15% to about 40%, or from about 20% to about 30%.

As indicated in the previous paragraph, heat treatments improve the first cycle efficiency. It is believed that the irreversible capacity loss during the first discharge and first charge of a battery is due to the formation of a passivating film or solid electrolyte interface (SEI) on the anode. This process consumes Li and electrolyte. Thus, improving the first cycle efficiency is important for improving the performance of anode materials. The heat treatments reduce the available materials for SEI or film formation, thereby reducing their deleterious effects.

In some embodiments, the nanocomposite materials may be used to prepare electrodes. The nanocomposite can be made into a slurry using acetylene black and polyimide binders solvents such as N-methylpyrrolidone (NMP) and water. The slurry is then cast and the solvent removed by drying under nitrogen. This process leads to a highly conductive electrode that results improved performance in the coin cell.

In another aspect, an electrochemical device is provided including an anode that includes the nanocomposite material, a cathode, and an electrolyte. Such devices include a lithium primary battery, a lithium secondary battery, a capacitor or a lithium air battery.

In some embodiments, the cathode may be an air electrode, or include materials such as spinels, olivines with formula LiM$_a$M'$_b$PO4 (where M and M' are a transition metal), LiCoPO$_4$, LiFePO$_4$, LiNiPO$_4$, LiCoO$_2$, LiNiO$_2$, LiNi$_{1-x}$Co$_y$Met$_z$O$_2$, LiMn$_{0.5}$Ni$_{0.5}$O$_2$, LiMn$_{0.3}$Co$_{0.3}$Ni$_{0.3}$O$_2$, LiMn$_2$O$_4$, LiFeO$_2$, LiMet$_{0.5}$Mn$_{1.5}$O$_4$, LiMet$_{0.5}$Mn$_{1.5}$O$_4$, Li$_{1+x}$Ni$_\alpha$Mn$_\beta$Co$_\gamma$Met'$_\delta$O$_{2-z'}$F$_{z'}$, A$_n$B$_2$(XO$_4$)$_3$ (Nasicon), vanadium oxide, or mixtures of any two or more such materials, where Met is Al, Mg, Ti, B, Ga, Si, Mn, or Co; Met' is Mg, Zn, Al, Ga, B, Zr, or Ti; A is Li, Ag, Cu, Na, Mn, Fe, Co, Ni, Cu, or Zn; B is Ti, V, Cr, Fe, or Zr; X is P, S, Si, W, or Mo; $0 \le x \le 0.3$, $0 \le y \le 0.5$, $0 \le z \le 0.5$; $0 \le x' \le 0.4$, $0 \le \alpha \le 1$, $0 \le \beta \le 1$, $0 \le \gamma \le 1$, $0 \le \delta \le 0.4$, and $0 \le z' \le 0.4$; and $0 \le n' \le 3$.

A variety of solvents may be employed in the electrolyte as the polar aprotic solvent. Suitable polar aprotic solvents include liquids and gels capable of solubilizing sufficient quantities of the lithium salt and the redox shuttle so that a suitable quantity of charge can be transported from the positive electrode to negative electrode. The solvents can be used over a wide temperature range, e.g., from −30° C. to 70° C. without freezing or boiling, and are stable in the electrochemical range within which the cell electrodes and shuttle operate. Suitable solvents include dimethyl carbonate; ethyl methyl carbonate; diethyl carbonate; methyl propyl carbonate; ethyl propyl carbonate; dipropyl carbonate; bis(trifluoroethyl) carbonate; bis(pentafluoropropyl) carbonate; trifluoroethyl methyl carbonate; pentafluoroethyl methyl carbonate; heptafluoropropyl methyl carbonate; perfluorobutyl methyl carbonate; trifluoroethyl ethyl carbonate; pentafluoroethyl ethyl carbonate; heptafluoropropyl ethyl carbonate; perfluorobutyl ethyl carbonate; fluorinated oligomers; dimethoxyethane; triglyme; dimethylvinylene carbonate; tetraethyleneglycol; dimethyl ether; polyethylene glycols; sulfones; and γ-butyrolactone.

Suitable electrolyte salts include alkali metal salts, alkaline earth salts, and ammonium salts. In some embodiments, the salts are alkali metal salts such as lithium salts, sodium salts, or potassium salts. In one embodiment, the salt is a lithium salt that may include, but is not limited to, $Li[B(C_2O_4)_2]$; $Li[BF_2(C_2O_4)]$; $LiClO_4$; $LiBF_4$; $LiAsF_6$; $LiSbF_6$; $LiBr$, $LiPF_6$; $Li[CF_3SO_3]$; $Li[N(CF_3SO_2)_2]$; $Li[C(CF_3SO_2)_3]$; $Li[B(C_6F_5)_4]$; $Li[B(C_6H_5)_4]$; $Li[N(SO_2CF_3)_2]$; $Li[N(SO_2CF_2CF_3)_2]$; $LiN(SO_2C_2F_5)_2$; $Li[BF_3C_2F_5]$; $Li[PF_3(CF_2CF_3)_3]$; or an lithium alkyl fluorophosphates.

The above description will be understood more readily by reference to the following examples, which are provided by way of illustration and are not intended to be limiting to any particular embodiment.

EXAMPLES

Example 1

Graphite powder is immersed in a solution of sulfuric acid, nitric acid, and potassium permanganate for between 1 to 24 hours at room temperature. The powder is dried and subjected to thermal shock treatment, e.g. a high temperature of 1,000° C. for 15-30 seconds under the flow of Ar gas. The thermal shock leads to the formation of exfoliated graphite worms, which are then subject to ultrasonication for 30 minutes. The ultrasonication causes mechanical shearing of the exfoliated graphite flakes into graphene containing two or more sheets or layers.

Example 2

Natural graphite flake from Sigma Aldrich was immersed in a solution of sulfuric acid and hydrogen peroxide (v/v=20/1) solution at 90° C. in a water bath for 1 hour. The powder was dried and then subjected to a thermal shock at 1000° C. for 45 seconds to obtain exfoliated graphite worms. The exfoliated graphite was then dispersed in n-methylpyrrolidone (NMP) under ultrasonication for 1 hour to form graphene.

Example 3

The same process is followed as in Example 1, except the thermal shock treatment was done under the flow of ammonia gas to prepare N-doped graphene.

Example 4

Si-graphene nanocomposite material was prepared by following the same process as in Example 1 to prepare graphene, or as in Example 3 to prepare N-doped graphene. Silicon is then deposited on doped or un-doped graphene and between the sheets or layers of graphene by chemical vapor deposition (CVD) process. The chamber is first purged with flowing Ar for 30 minutes and then heated to 550° C. Silane gas ($SiH_4$) is added to a CVD reactor containing the doped or un-doped graphene and the silane gas is allowed to infuse the graphene for about 60 minutes. The heating decomposes the silane gas into silicon particles and hydrogen gas. Upon cooling, a layered nanocomposite material with graphene and silicon is formed. Scanning electron microscope (SEM) and transmission electron microscope (TEM) images confirmed that some of the silicon particles are intercalated within the layers of the graphene.

Example 5

A nanocomposite material was prepared by following same the process as Example 1 to prepare graphene, or Example 3 to prepare N-doped graphene. The doped or un-doped graphene is placed in a fluidized CVD reactor and pre-heated to 850° C. Liquid trichlorosilane (TCS) is injected into the low-temperature zone (100° C.) of a CVD reactor and vaporized. The TCS vapors are then carried downstream to the high temperature zone by hydrogen to the graphene where the TCS subsequently decomposes on and between the sheets or layers of the graphene. The nanocomposite material contains Si nanoparticles distributed within and on the graphene.

Example 6

An electrode was made by casting slurry of 70 wt % of un-doped Si-graphene, 20 wt % acetylene black, and 10 wt % polyimide, dispersed in N-Methyl-2-pyrrolidone (NMP), on a copper foil, and drying completely in a vacuum oven at 75° C. overnight. The material was then subjected to a high temperature treatment at about 400° C. for 1 hour under flowing $N_2$ gas.

Example 7

Testing of the electrodes. 2032-type coin cells were prepared with a Li foil as a negative electrode, a 25 μm Microporous Trilayer Membrane (Celgard 2325) as separator, the above doped and un-doped electrodes as the positive electrode and sufficient amount of electrolyte. The electrolyte was 10 wt % of fluoroethylene carbonate (FEC) dissolved in a 3:7 by weight mixture of ethylene carbonate (EC) and ethyl methyl carbonate (EMC) containing 1.2M $LiPF_6$.

The electrochemical performance of doped and un-doped Si-Graphene composite materials were tested using computerized battery test systems manufactured by Maccor, Inc. The cell was run between 0.02 V to 1.2 V with a constant current of 100 mA/g for the first two cycles and followed by 400 mA/g load.

Figure 2:
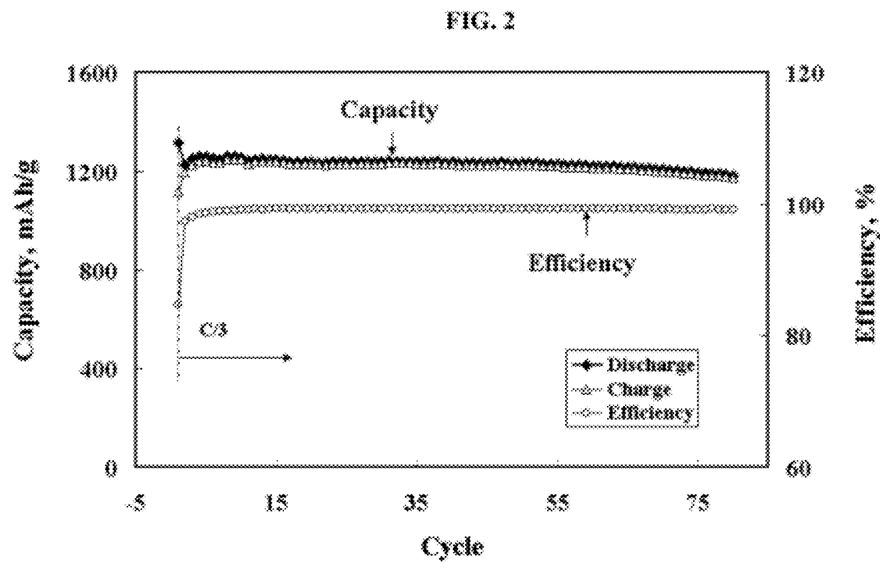
FIG. 2 is a dual axis graph of the capacity (left) and the efficiency (right) v. cycle number for a silicon-graphene nanocomposite material prepared according to the examples.

FIG. 2 shows the cycle performance and efficiency of Si-Graphene (undoped) composite materials. The reversible capacity of these Si-Graphene composites materials is 1173 mAh/g after 80 cycles at C/3 rate, with only 4.25% reversible capacity loss. The results demonstrate that Si-Graphene composite materials exhibit over three times the reversible capacity of graphite materials (less than 372 mAh/g).

Figure 3:
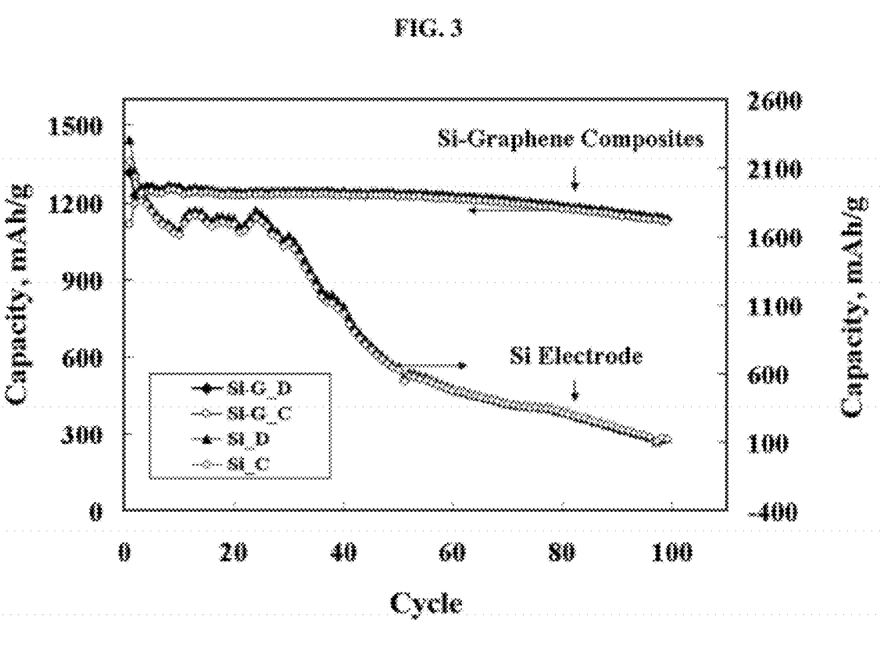
FIG. 3 is a graph of capacity v. number of cycles of a silicon-graphene nanocomposite material prepared according to the Example 6, as compared to a bulk silicon material used as the anode in a coin cell battery.

FIG. 3 shows the cycle performance of Si-Graphene composite materials (undoped) as compared to a bulk Si electrode. The reversible capacity of these Si-Graphene composites materials is 1173 mAh/g after 80 cycles at C/3 rate, with only 4.25% reversible capacity loss. The Si-Graphene nanocomposite has significantly improved reversible capacity as compared to Si. Thus, the nanocomposites exhibit a significant increase in specific capacity together with significant improvements in long term stability when used as an anode material. The results demonstrate that Si-Graphene composite materials exhibit high reversible capacity of 1173 mAh/g, which is over three times the reversible capacity of graphite materials (less than 372 mAh/g).

Example 8

Composite Si-Graphene material prepared using Example 4 or 5 was heated to 950° C. under the presence of hydrogen gas for 120 minutes to prepare a reduced Si-Graphene nanocomposite material. Other reducing gases, in addition to, or instead of, hydrogen may be used.

Example 9

Figure 4A:
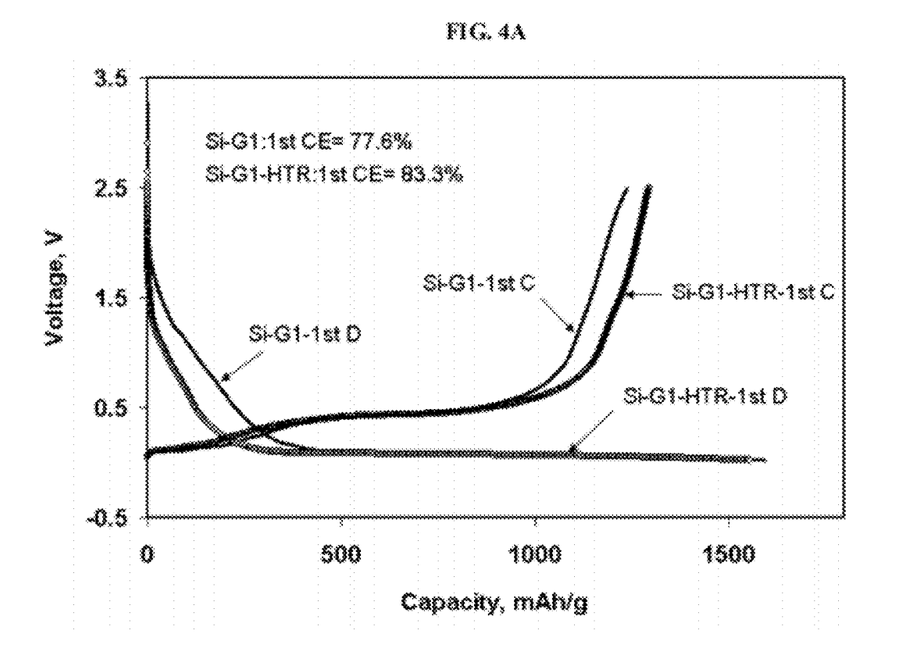
Figure 4B:
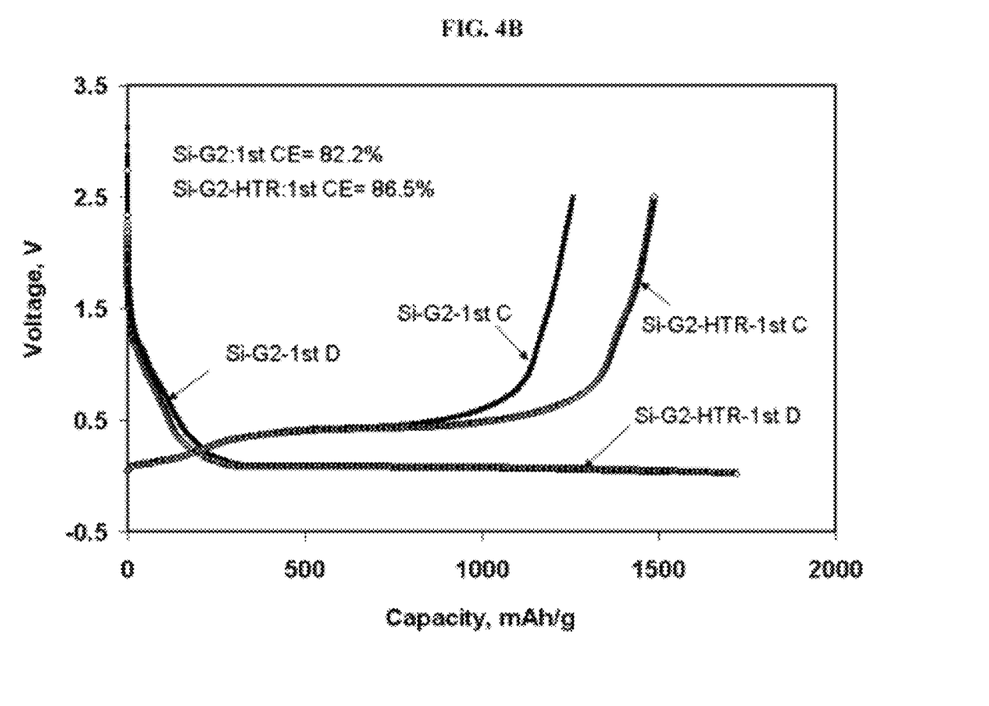

The reduced Si-Graphene nanocomposite material prepared according to Example 8 is fashioned into electrode and placed in coin cell as described in Example 7. The electrochemical performance of the coin cell with the reduced Si-Graphene material is compared to the Si-Graphene coin cell prepared in Example 6 in FIGS. 4A and 4B as the cells are subjected to the first charging cycle. The reduced Si-Graphene material (Si-G1-HTR-1st C) has a larger first cycle efficiency of 88.3% as compared to the efficiency of the Si-Graphene material (Si-G1-1st C), 77.6%. Sample in FIG. 4A has silicon loading of 27 wt %, while it is 35 wt % for FIG. 4B. The labels with the "C" are the charging cycles and the "D" labels for the discharging cycles. The HTR labels refer to the hydrogenated (i.e. reduced) samples.

Figure 5:
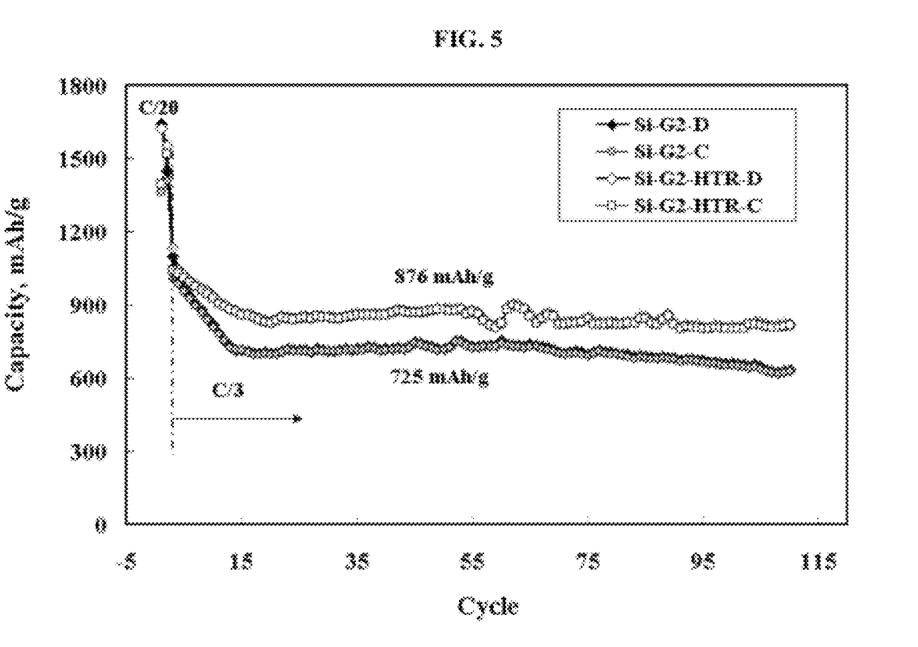
FIG. 5 is a graph of capacity v. number of cycles of the silicon-graphene nanocomposite material prepared according to the Example 7.

In FIG. 5, the reversible capacity of the reduced Si-Graphene material was compared to the Si-Graphene material used in Example 6. The coin cells were tested at C/3 rate for 50 cycles. The reversible capacity of the reduced Si-Graphene is 876 mAh/g compared with 725 mAh/g for untreated Si-Graphene material, corresponding to an improvement of 20.8%. Furthermore, the reduced Si-graphene has higher stability than the un-reduced material.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

For the purposes of this disclosure and unless otherwise specified, "a" or "an" means "one or more".

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A process comprising:
   contacting in a fluidized bed reactor, a gaseous electroactive material precursor with a powdered, exfoliated graphene to form a nanocomposite material;
   wherein:
   the powdered, exfoliated graphene comprises a plurality of layers;
   the nanocomposite material comprises either:
      an electroactive material intercalated between individual layers of the plurality of layers; or
      an electroactive material both intercalated between individual layers of the plurality of layers and deposited on one or more surfaces of the individual layers of the plurality of layers; and
   the electroactive material comprises Sn, Pb, Al, Au, Pt, Zn, Cd, Ag, Mg, or Mo.

2. The process of claim 1, wherein the electroactive material comprises an oxide of Sn, Pb, Al, Au, Pt, Zn, Cd, Ag, Mg, or Mo.

3. The process of claim 1, wherein the electroactive material comprises Sn.

4. The process of claim 1, wherein the contacting comprises depositing the gaseous electroactive material precursor via chemical vapor deposition.

5. The process of claim 1, wherein the electroactive material precursor includes a tin-containing compound.

6. The process of claim 5, wherein the tin-containing compound is monobutyltin trichloride, methyltin trichloride, isobutyltin trichloride, butyl dichlorotin acetate, butyldichlorotin dicetate, diisobutyltin dichloride, methyltin trichloride, dimethyltin dichloride, dibutyltin dichloride, di-t-butyltin dichloride, or tin tetrachoride.

7. The process of claim 1, wherein the electroactive material comprises a film.

8. The process of claim 1, wherein the electroactive material comprises particles.

9. The process of claim 1, further comprising heating the nanocomposite material to a temperature between 500° C. to 1500° C.

10. The process of claim 9, wherein the heating comprises heating the nanocomposite material in the presence of a reactive gas comprising hydrogen, ammonia, a phosphorus containing gas, or a boron-containing gas.

* * * * *